United States Patent [19]
Rambow

[11] Patent Number: 4,855,965
[45] Date of Patent: Aug. 8, 1989

[54] TIME RAMPED GAIN FOR BOREHOLE TELEVIEWER

[75] Inventor: Frederick H. K. Rambow, Houston, Tex.

[73] Assignee: Shell Oil Company, Houston, Tex.

[21] Appl. No.: 935,422

[22] Filed: Nov. 26, 1986

[51] Int. Cl.⁴ ............................................. G01V 1/00
[52] U.S. Cl. ......................................... 367/69; 367/28
[58] Field of Search .................................. 367/25–28, 367/34, 65–67, 69, 901, 98; 181/102–107; 364/422

[56] References Cited

U.S. PATENT DOCUMENTS

| | | | |
|---|---|---|---|
| 3,275,095 | 9/1966 | Blizard | 367/27 |
| 3,277,438 | 10/1966 | Ford et al. | 367/65 |
| 3,289,157 | 11/1966 | Brokaw | 367/34 |
| 3,292,729 | 12/1966 | Blizard | 367/27 |
| 3,369,626 | 2/1968 | Zemanek, Jr. | 367/69 |
| 3,478,839 | 11/1969 | Zemanek, Jr. | 367/25 |
| 3,724,589 | 4/1973 | Chapman, III | 367/27 X |
| 4,043,181 | 8/1977 | Nigam | 73/67.8 R |
| 4,463,378 | 7/1984 | Rambow | 367/69 X |
| 4,520,830 | 6/1985 | Flanagan, III | 128/660 |
| 4,535,299 | 8/1985 | Streckmann et al. | 367/67 X |
| 4,601,024 | 7/1986 | Broding | 367/86 |
| 4,691,307 | 9/1987 | Rambow | 367/69 |

FOREIGN PATENT DOCUMENTS

| | | |
|---|---|---|
| 146428 | 6/1985 | European Pat. Off. |
| WO81/00807 | 4/1981 | PCT Int'l Appl. |
| 2057687 | 4/1981 | United Kingdom |
| 2133882 | 8/1984 | United Kingdom |

OTHER PUBLICATIONS

Georgi, Daniel T., Geometrical Aspects of Borehole Televiewer Images, SPWLA 26th Annual Logging Symposium, Jun. 1985, pp. 1–19.
Heard et al., Development of a Geothermal Acoustic Borehole Televiewer, Sandia Report SAND 83-0681, Aug. 1983, pp. 5–83.
Rambow, F. M. K., The Borehole Televiewer: Some Field Examples, SPWLA 25th Annual Logging Symposium Jun. 1984, pp. 1–21.
Broding et al., A Sonic Technique for Cement Evaluation, SPWLA 27th Annual Logging Symposium Jun. 1986, pp. 1–16.

*Primary Examiner*—Brian S. Steinberger

[57] ABSTRACT

Amplifier gain is time ramped to increase amplification of the signal with increasing mud transit time and attenuation. Amplitude, ramp slope, and ramp onset time are independently controllable from the surface.

11 Claims, 3 Drawing Sheets

TIME RAMPED GAIN FOR BOREHOLE TELEVIEWER

BACKGROUND OF THE INVENTION

The present invention relates to well logging, and in particular to improvements in a borehole logging tool referred to as a borehole televiewer, or BHTV. Tools of this type are described, for example, in U.S. Pat. Nos. 3,369,626 (Zemanek, Jr., issued Feb. 20, 1968), 3,478,839 (Zemanek, Jr., issued Nov. 18, 1969), 4,463,378 (Rambow, issued July 31, 1984), and 4,601,024 (Broding, issued July 15, 1986).

In general, borehole televiewer logging tools operate acoustically by periodically pulsing a rotating acoustic transducer to emit a sequence of acoustical pulses directionally into the borehole toward the borehole wall, and analyzing the echos which are reflected back to the tool. The amplitude of the reflected signal may then be displayed on a cathode ray tube, the display sometimes being photographed for future reference. Typically, the display represents a map of the borehole wall split along the north direction and laid out flat. Additionally, a polar display may be produced, in which case the radius of the circular trace is determined by the time-of-flight of the acoustic pulse, thus presenting a cross-sectional profile of the borehole. Another display, similar to the amplitude display, is modulated by the time-of-flight signal rather than the amplitude signal. The latter can be converted into a pseudo-three-dimensional image by adding a slight bias to the vertical sweep according to the magnitude of the time-of-flight signal. BHTV tools typically include means for monitoring the tool orientation within the borehole, such as a fluxgate magnetometer rotating in unison with the transducer. A good technical description of a borehole televiewer suitable for use in a geothermal environment may be found in "Development of a Geothermal Acoustic Borehole Televiewer", by Fred B. Heard and Tom J. Bauman, Sandia Report SAND83-0681, August 1983.

One of the principal and extremely valuable benefits furnished by the BHTV logging tool is the pseudo "visual" image of the borehole wall which it furnishes. Subtleties in the formation, bedding, bedding planes, dip, and so forth, can be observed and studied in a manner unavailable elsewhere. Especially in the oil industry, conventional optical viewing devices do not suffice, in part due to the typically extremely hostile environment, but primarily because the fluid medium in the borehole is normally opaque to optical energy.

As shown in the above-noted publications, borehole televiewers scan radially, typically with a single transducer, essentially looking at a small ring encircling the transducer in the transverse plane thereof. As the borehole televiewer is then moved vertically through the borehole, the path or trail of this ring, as it moves along the borehole wall, in turn describes the wall. This description is then accumulated to generate the displays discussed above.

Not only is the fluid medium in a typical borehole opaque to optical energy, it is usually quite attenuating to acoustical energy as well. That is, in order to contain the elevated pressures commonly encountered in hydrocarbon bearing formations, additives are mixed into the fluid in the borehole. This slurry (referred to as "mud" in the industry) has a density which is adjusted, either by mixing in more additive or by diluting with more water, as needed for the conditions at hand. Unfortunately, the mud in the borehole acts as an acoustic attenuator, reducing the amplitude of the signal as the mud transit distance increases. A typical mud attenuation factor is about 1db/inch/percent of suspended solids in fresh water muds. Since typical borehole diameters are only a few inches greater than the diameter of the borehole televiewer, it will be readily appreciated that even rather small changes in borehole diameter can seriously impact the quality of the image being generated. Of course, not only are uneven borehole walls (e.g., washed out areas, vuggy areas, etc.) negatively impacted, but intentional changes in the borehole size (such as where the size of the drill bit was changed) as well as zones where the borehole was drilled very large to begin with, can drive a televiewer out of its operational capability, especially in heavily attenuating muds. This is illustrated figuratively in FIGS. 2A and 2B, the former showing the effects of mud attenuation on reflected signal amplitude in an 8-inch borehole, and the latter showing the trace which would be seen in a 10-inch borehole. Observe as well that, not only is the reflection signal increasingly attenuated with distance, but there is also a significant difference in amplitude between the initial or "fire" pulse and the reflection or signal pulse.

In the typical prior art operational regime, the receiver amplifier for the transducer is turned on just after the fire pulse. In an ideal system, nothing would be heard by the amplifier until the reflection signal returned from the borehole wall. Unfortunately, this is not what actually happens. In actual practice, there are reflections at the borehole televiewer window, and, particularly in heavy muds, large amounts of signal scattering. The former causes a problem known as ringdown of the window/transducer system. The latter causes false echos.

One solution to these problems is to keep the amplification level rather low during the initial period, and then to step it up to a new, much higher level just before the expected arrival of the return or reflection signal. While a definite step in the right direction, this solution still fails to compensate dynamically for the borehole attentuation of the signals discussed earlier. Where there are differences in the mud-induced attenuation of the signal, time-dependent borehole attenuation of the detected acoustic energy signals will still cause distortion or degradation of the acoustic image generated therefrom.

A need therefore remains for an improved borehole imaging apparatus and method which can compensate not only for initial ringdown and mud reflections, but also for mud attenuation and time-dependent borehole attenuation of the detected borehole reflection acoustic energy signals. Preferably, such a method and apparatus would be dynamically responsive, on a pulse-by-pulse basis, usable over the widest possible range of borehole conditions, adjustably controllable from the surface for precisely responding to this wide range of conditions, and easy to implement in an inexpensive, uncomplicated, highly versatile, efficient, and reliable method and apparatus for the greatest possible utilization in borehole imaging.

SUMMARY OF THE INVENTION

Briefly, the present invention meets the above needs and purposes by incorporating a special time variable gain control circuit for processing the received borehole reflection signals. In the preferred embodiment, the circuit applies a fixed amount of gain or attenuation up until a given, operator selectable time, and then begins to ramp the gain up exponentially. During this ramping period, the gain continues to increase as a function of time, so that the amount of gain applied to each signal is a function of the propagation time of the acoustic energy through the borehole fluid. Thus, by keeping the gain initially low, false signal effects such as initial ringdown and mud reflections are suppressed. Then, by commencing to increase the amount of gain as a function of time, time-dependent borehole fluid attenuation of the acoustic energy is corrected.

More specifically, the present invention includes an acoustic transducer mounted and supported for movement within a borehole for transmitting and receiving acoustic energy signals through the fluid in the borehole. A time ramped gain amplifier, controllable from the surface and operatively connected with the transducer, compensates for initial ringdown, mud reflections, and time-dependent borehole fluid attenuation of the acoustic energy. The time ramped gain amplifier includes a variable pulse delayer/stretcher which delays the onset of the increase in the amplifier gain for a predetermined delay. In the preferred embodiment, this delay can be adjusted from the surface by operator control. The time ramped gain amplifier also includes a surface controllable gain rate or slope controller, so that, once the increase in the amount of gain has commenced, the time-dependent rate at which the gain increases can be adjusted for the conditions at hand. These adjustments are applied on a pulse-by-pulse (i.e., signal-by-signal) basis, since the time-dependent attenuation of each pulse is a unique function of its own transit time within the borehole.

It is therefore an object of the present invention to provide an improved borehole imaging method and apparatus; such a method and apparatus in which acoustic energy is generated in a borehole, as by an acoustic transducer, and transmitted and received as acoustic energy signals through the fluid in a borehole; in which such signals are detected after reflection from the sidewall of the borehole; in which false signal effects are compensated dynamically; in which such dynamic compensation for mud attenuation of the borehole reflection signals and time-dependent borehole attenuation of the detected acoustic energy signals may be accomplished by a variable gain amplifier which continues to increase the amount of gain applied to each such signal as a function of the propagation time of the acoustic energy through the borehole fluid; in which such a variable gain amplifier may be controllable from the surface; in which the variable gain amplifier can be adjusted for controlling the time-dependent rate at which the amplification of the amplifier increases; in which the increase in the gain of the amplifier can be delayed for a predetermined delay period; in which the delay period is also adjustable; which thus reduce false signal effects such as initial ringdown, mud reflections, and time-dependent borehole fluid attenuation of the acoustic energy; and to accomplish the above objects and purposes in an inexpensive, highly versatile, uncomplicated, efficient, and highly reliable method and apparatus readily suited to the widest possible utilization in borehole imaging.

These and other objects and advantages of the invention will be apparent from the following description, the accompanying drawings, and the appended claims.

DESCRIPTION OF THE PREFERRED EMBODIMENT

Figure 1:
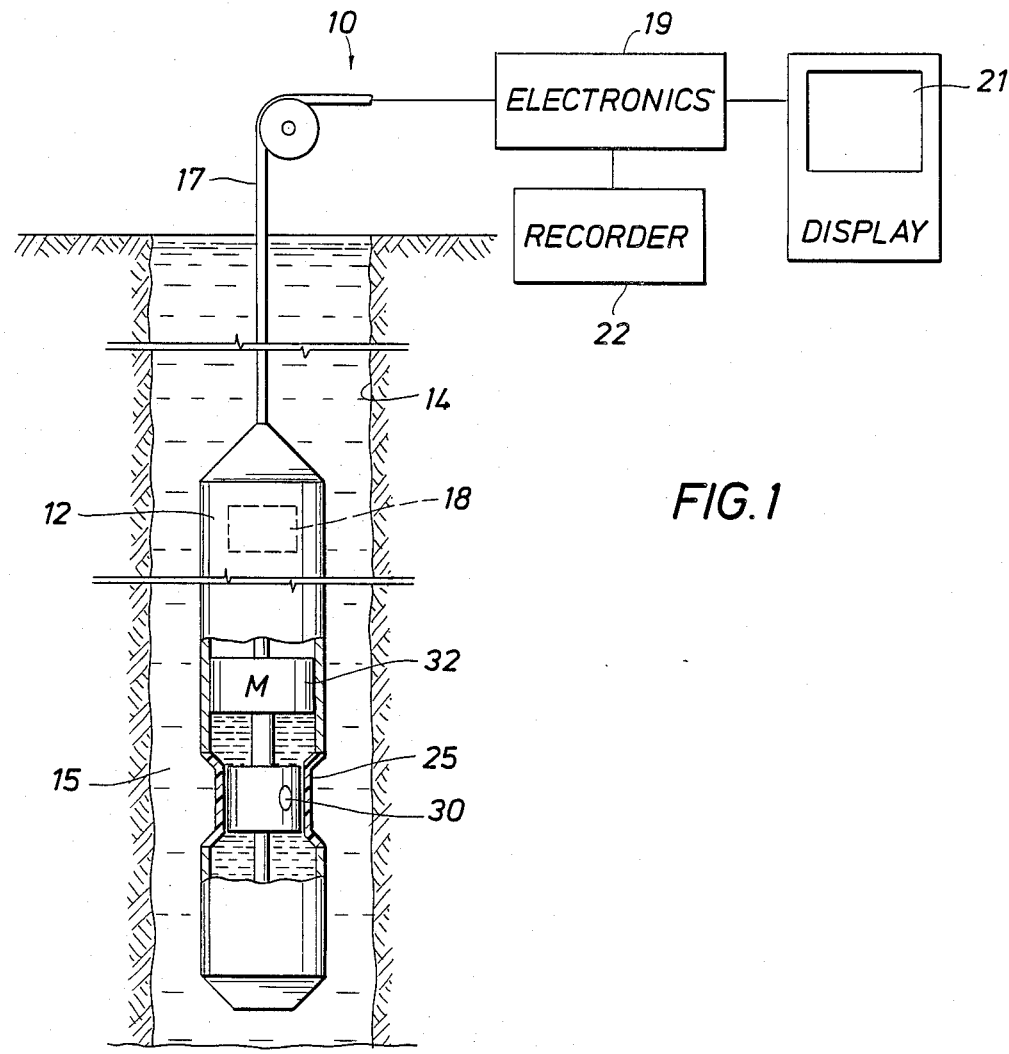
FIG. 1 is a somewhat figurative, partially broken-away illustration showing a borehole imaging apparatus according to the present invention located within a borehole.

With reference to the drawings, the new and improved borehole imaging apparatus, and the method for imaging a borehole therewith, according to the present invention, will be described. A borehole televiewer system 10, including a downhole sonde having a housing 12, is positioned in a borehole 14 filled with a fluid drilling mud 15. The sonde housing 12 is supported in borehole 14 by a conventional logging cable 17. Cable 17 provides both physical support for moving the sonde vertically within borehole 14, and also is a communications link between the electronics package 18 located in housing 12 and the surface electronics 19 located at the top of borehole 14. System 10 may also include a suitable display unit 21, such as a CRT display, and a recorder such as a video recorder 22.

Figure 2A:
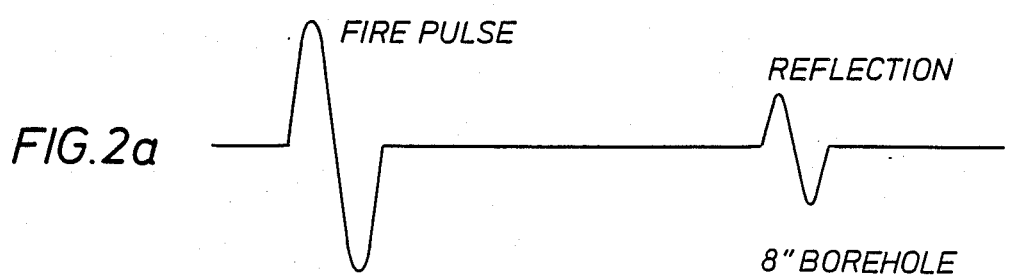
FIGS. 2A and 2B are figurative illustrations showing time-dependent attenuation of the reflection signal resulting from borehole attenuation effects, such as mud attenuation, as a consequence of transmission through variable distances within the borehole.
Figure 2B:
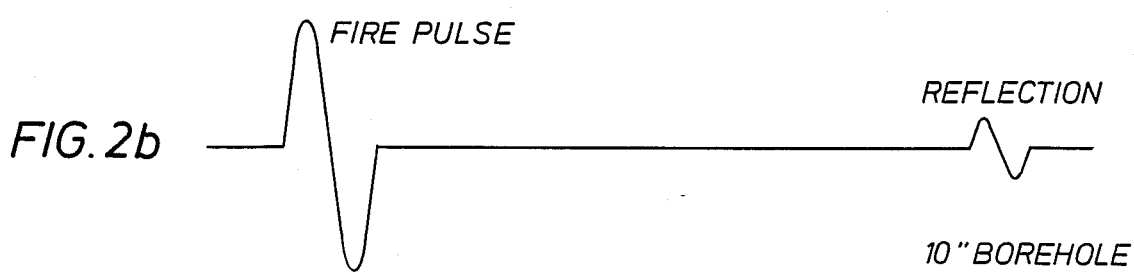

Around the periphery of housing 12 is an acoustic window 25. Behind window 25, within housing 12, is an acoustic transducer 30 mounted for rotation on the longitudinal axis of the housing. Driven by a drive motor 32, the transducer sweeps radially around the housing 12, projecting acoustic pulses outwardly through acoustic window 25 and receiving reflections back from the wall of the borehole 14. As previously discussed, FIG. 2 presents an idealized illustration of the mud attenuating effects on the reflection pulses received back from the borehole wall.

Figure 3:
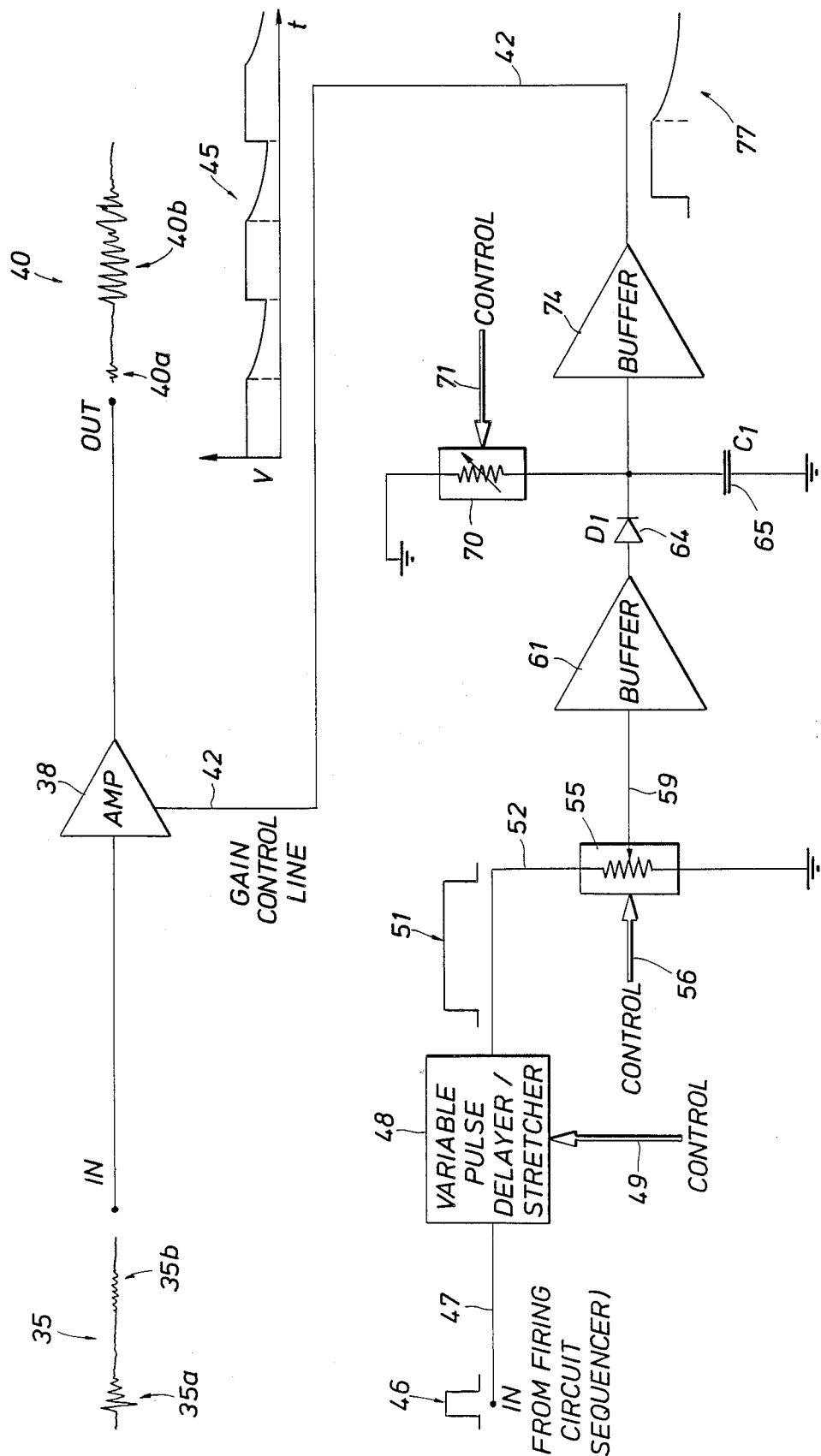
FIG. 3 is a block diagram of a circuit suitable for implementing the present invention.

Referring to FIG. 3, a preferred block diagram of a circuit for performing the present invention is illustrated. Wave forms illustrative of the signals present at various portions within the circuit are also shown adjacent those portions (although not necessarily to scale). Thus, a representative input wave form 35 has a first, rather high amplitude window mud ringdown portion 35a, followed some time later by the returning reflection signal 35b. This signal is supplied to a variable gain amplifier 38, which under controls according to the present invention and further described below, produces an output wave form 40. The representative wave form 40 clearly shows significant suppression of the window mud ringdown signal portion 40a and substantial enhancement of the borehole wall reflection signal 40b. Further, when operated according to the present invention, the reflection signals 40b, from one pulse to the next, will have amplitude substantially independent of differential mud attenuation caused by differential transit times (distances).

In the preferred embodiment, the variable gain amplifier 38 is a video amplifier integrated circuit such as an MC1590G, having an agc line 42. Any suitable video amplifier may, of course, be used. The MC1590G is convenient because it has an "inverting" agc input. That is, the gain of the amplifier decreases as the input signal to the agc control line 42 increases.

The control signal 45 which is applied to the gain control line 42 for amplifier 38 is generated as follows: when the acoustic transducer 30 in the borehole televiewer 10 is fired, the pulse 46 from the firing circuit sequencer (not shown) is also applied to the input line 47 of a variable pulse delayer/stretcher 48. Preferably, this is done with a digital counter controlled as at 49 from the surface. The resulting stretched pulse 51, from the initial input pulse 46, is shown being applied by a line 52 to a level controller 55.

Figure 4:
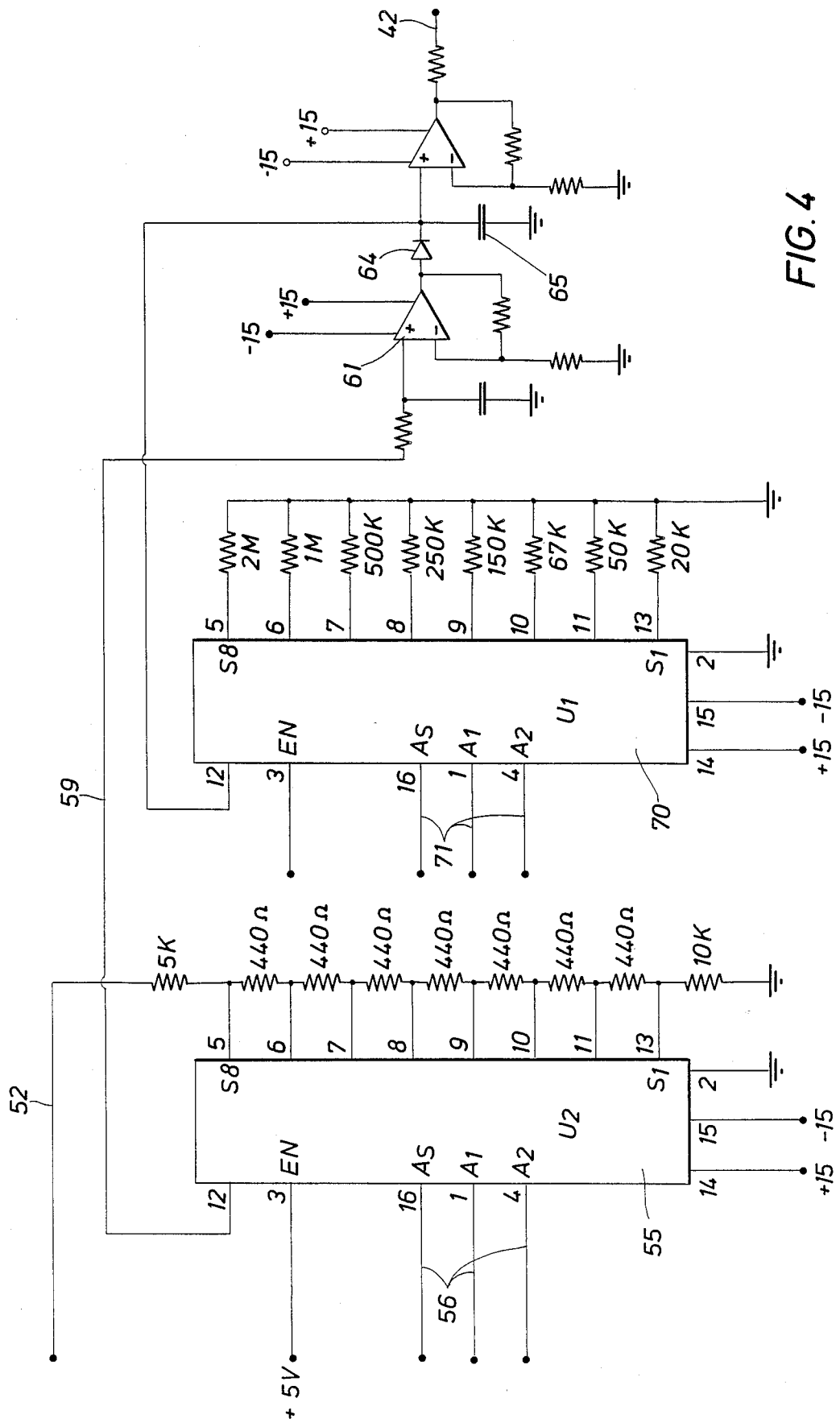
FIG. 4 is a circuit diagram of a preferred embodiment of a portion of the circuit illustrated in FIG. 3.

In its simplest form, level controller 55, preferably also under surface control as shown at 56, is but a voltage dividing potentiometer. In the preferred embodiment illustrated in FIG. 4, it is implemented digitally using an Analog Devices AD7501 multiplexer which controls a voltage divider resistor chain that defines the maximum signal level going into the control line 59. Clearly, any other suitable level controller may be employed.

The signal on line 59 then passes through a unity gain buffer amplifier 61 to a diode 64. Diode 64, in turn, charges a capacitor 65, which is then discharged on a time-dependent basis through a variable resistor 70. Variable resistor 70 is also under surface control, as at 71, similarly as with controls 49 and 56. Also, as with level controller 55, in the preferred embodiment the variable resistor 70 is a somewhat more sophisticated, digitally controlled voltage divider, again using an AD7501 multiplexer, as shown more particularly in FIG. 4. Also, while this circuit is again convenient, any appropriate arrangement for discharging capacitor 65 may be employed.

Capacitor 65 is charged through diode 64, so that it can lose its charge only through the variable resistor 70 and the unity gain buffer amplifier 74 which follows it. If the input impedance of the buffer amplifier 74 is sufficiently high, it will not contribute appreciably to the voltage decay of capacitor 65. Thus, the wave form at the output of buffer amplifier 74, on the gain control line 42, will appear as illustrated at 77. The series of these pulses in sequence, over time, then results in the wave form shown at 45.

As will be appreciated, therefore, the present invention has numerous advantages. The threshold gain level which is initially applied to the signal and primarily spans the initial ringdown and mud reflections period can be easily adjusted by the level controller 55. The inflection point or time at which the amplification begins to ramp upwardly is readily adjustable by means of the variable pulse delayer/stretcher 48. The rate at which the amplification increases (which would be adjusted at the surface to match as closely as possible the rate of signal attenuation for the conditions at hand) is adjusted by the variable resistance network 70. With this arrangement a dynamic range of over 50 dB can be achieved which is often considerably more than necessary. In light muds where less attenuation is experienced, the decay constant of the ramp may easily be set to be quite long, as appropriate. Thus, the present invention provides great versatility and utility in a wide range of operating conditions.

While several variations on the present invention have been discussed above, others will be readily apparent as well. For example, although the ramp is shown as smoothly increasing on an analog basis, it will be apparent that it could be implemented digitally, (i.e., stepwise) if desired. In such a case, the steps could either be sufficiently fine as to be unnoticeable, or could be clamped at a suitable level once signal arrival was detected. Likewise, although an exponentially increasing gain is mentioned earlier, any functional form may be realized with suitable circuitry. For example, an arbitrary function could be loaded into digital memory and then sequentially read out driving a digital to analog converter which in turn would provide even greater versatility, it might not be the best trade-off between versatility and simplicity.

Therefore, while the methods and forms of apparatus herein described constitute preferred embodiments of this invention, it is to be understood that the invention is not limited to these precise methods and forms of apparatus, and that changes may be made therein without departing from the scope of the invention.

What is claimed is:

1. A borehole imaging apparatus wherein a rotating acoustic transducer means is periodically pulsed to emit a sequence of acoustic pulses into the borehole fluid toward the borehole wall and the reflected response of the acoustic pulse is received by said transducer means and converted to a related electrical signal, the improvement, comprising:

electrical signal compensating means located in the borehole for compensating substantially each of the electrical signals, said compensating means including variable gain amplifier means controllable from the surface for continuing to increase the amount of gain applied to each said electrical signal as a function of the propagation time of the acoustic energy through the borehole fluid, to reduce the effects such as initial ringdown, mud reflections, and time-dependent borehole fluid attenuation of said acoustic energy.

2. The apparatus of claim 1 wherein said variable gain amplifier means includes means for adjusting the time-dependent rate at which the amplification of said amplifier means increases.

3. The apparatus of claim 1 wherein said variable gain amplifier means includes means for delaying the onset of said increase in the gain of said amplified means for a predetermined delay period.

4. The apparatus of claim 3 wherein said variable gain amplifier means includes means for adjusting the duration of said delay period.

5. An imaging apparatus for use in a fluid-filled borehole, comprising:

at least one rotating acoustic transducer supported on said mounting means for transmitting and receiving acoustic energy signals through the fluid in such a borehole; and time ramped gain amplifier means disposed in said mounting means and controllable from the surface, said amplifier being operatively connected with said transducer means for compensating for initial ringdown, mud reflections, and time-dependent borehole fluid attenuation of said acoustic energy, said time ramped gain amplifier means including:

(i) means for continuing to increase the amount of gain applied to each said signal by said amplifier means on a signal-by-signal basis as a function of the propagation time of each corresponding said signal through the borehole fluid;

(ii) means for adjusting the time-dependent rate at which the amplification of said amplifier increases;

(iii) means for delaying said increase in the gain of said amplifier for a predetermined delay period; and (iv) means for adjusting said delay period.

6. An imaging apparatus for use in a fluid-filled borehole, comprising:

mounting means moveable within a borehole;

at least one acoustic transducer supported on said mounting means for transmitting acoustic pulses directionally into the fluid toward the borehole wall and receiving acoustic energy that is reflected through the fluid back to the transducer and converting the received acoustic energy to a related electrical signal; and a time ramped gain amplifier means controllable from the surface and operatively connected with said transducer means for compensating said related electrical signal for initial ringdown, mud reflections, and time-dependent borehole fluid attenuation of said acoustic pulse signals, said time ramped gain amplifier means including:

(i) a variable gain amplifier operatively connected for receiving said related electrical signals;

(ii) a level controller operatively controllable from the surface and connected for controlling the initial gain of said variable gain amplifier;

(iii) a ramp slope controller connected for continuing to increase the amount of gain applied to each of said electrical signals by said variable gain amplifier on a signal-by-signal basis as a function of the propagation time of each corresponding said acoustic signal through the borehole fluid;

(iv) means in said ramp slope controller, operatively controllable from the surface, for adjusting the time-dependent rate at which the amplification of said variable gain amplifier increases;

(v) a variable delayer for delaying said increase in the gain of said amplifier for a predetermined delay period; and (vi) means connected to said variable delayer and operatively controllable from the surface for adjusting said delay period.

7. A method for imaging a fluid-filled borehole, comprising:

generating a plurality of discrete acoustic signals in such a borehole and directing said acoustic signals to scan the borehole wall;

detecting such acoustic signals after reflection from the borehole wall;

converting the detected acoustic signals to related electrical signals; and dynamically compensating said related electrical signals for time-dependent borehole attenuation of the detected acoustic energy signals by continuing to increase the amount of gain applied to each related electric signal as a function of the propagation time of the acoustic energy through the borehole fluid prior to transmission of the related electrical signals from the borehole.

8. The method of claim 7 further comprising adjusting the time-dependent rate at which the gain is increased.

9. The method of claim 7 further comprising delaying the onset of the increase in the gain for a predetermined delay period.

10. The method of claim 9 further comprising adjusting the duration of the delay period.

11. A method for imaging a fluid-filled borehole, comprising:

generating a plurality of discrete acoustic energy signals in the borehole and directing said acoustic signals to scan the borehole wall;

receiving the acoustic signals that are reflected from the borehole wall;

converting the received acoustic signals to related electrical signals;

dynamically compensating for time-dependent borehole attenuation of the detected acoustic energy signals by continuing to increase the amount of gain applied to each said electrical signals as a function of the propagation time of the acoustic energy through the borehole fluid;

adjusting the time-dependent rate at which the gain is increased;

delaying the onset of the increase in the gain for a predetermined delay period;

adjusting the duration of the delay period; and generating an acoustic image of the borehole using said reflected and compensated signals.

* * * * *